United States Patent
Brkic

(10) Patent No.: US 10,275,215 B2
(45) Date of Patent: Apr. 30, 2019

(54) DETERMINING UNSIGNED NORMALIZED INTEGER REPRESENTATIONS OF A NUMBER IN DATA PROCESSING SYSTEMS

(71) Applicant: ARM Limited, Cambridge (GB)

(72) Inventor: Toni Viki Brkic, Lund (SE)

(73) Assignee: Arm Limited, Cambridge (GB)

( * ) Notice: Subject to any disclaimer, the term of this patent is extended or adjusted under 35 U.S.C. 154(b) by 172 days.

(21) Appl. No.: 15/227,149

(22) Filed: Aug. 3, 2016

(65) Prior Publication Data
US 2017/0039031 A1    Feb. 9, 2017

(30) Foreign Application Priority Data

Aug. 3, 2015  (GB) .................................... 1513712.8
Aug. 3, 2015  (GB) .................................... 1513716.9

(51) Int. Cl.
| | |
|---|---|
| *G06F 9/30* | (2018.01) |
| *G06F 5/01* | (2006.01) |
| *H03M 7/24* | (2006.01) |
| *G06F 7/483* | (2006.01) |

(52) U.S. Cl.
CPC .............. *G06F 5/012* (2013.01); *G06F 7/483* (2013.01); *H03M 7/24* (2013.01); *G06F 9/30025* (2013.01); *G06F 2205/00* (2013.01)

(58) Field of Classification Search
CPC .. H03M 7/02–7/04; H03M 7/24; G06F 7/499; G06F 7/49942; G06F 7/49947; G06F 7/49957; G06F 9/30025
USPC .................. 708/204, 208, 496–497, 550–551
See application file for complete search history.

(56) References Cited

U.S. PATENT DOCUMENTS

| | | | | |
|---|---|---|---|---|
| 5,161,117 A | * | 11/1992 | Waggener, Jr. | .......... G06F 5/012 708/204 |
| 9,264,066 B2 | * | 2/2016 | Blomgren | ............... H03M 7/24 |
| 2014/0280405 A1 | * | 9/2014 | Rose | ........................ G06F 5/01 708/201 |
| 2015/0347108 A1 | | 12/2015 | Munshi et al. | |

OTHER PUBLICATIONS

Microsoft, "Data Conversion Rules", https://msdn.microsoft.com/en-us/library/windows/desktop/dd607323, Dec. 2014, retrieved from https://web.archive.org/web/20141214015355/https://msdn.microsoft.com/en-us/library/windows/desktop/dd607323(v=vs.85).aspx.*
Brkic, "Data Processing Systems," U.S. Appl. No. 15/227,164, filed Aug. 3, 2016, (Continued)

*Primary Examiner* — Matthew D Sandifer
(74) *Attorney, Agent, or Firm* — Vierra Magen Marcus LLP

(57) ABSTRACT

A method of operating a data processing system when determining a b-bit unsigned normalized integer representation U of a number x is disclosed. When the number x has a value between 0 and 1, the method comprises determining the integer part I of $(x \times 2^b)$, and determining whether to use the integer part I, an incremented version of the integer part I, or a decremented version of the integer part I for the unsigned normalized integer representation U of the number x based on a comparison that uses the fractional part F of $(x \times 2^b)$ and the number x.

17 Claims, 3 Drawing Sheets

(56) References Cited

OTHER PUBLICATIONS

Amendment dated Feb. 5, 2018, in U.S. Appl. No. 15/227,164, filed Aug. 3, 2016.
Final Office Action dated Apr. 27, 2018, in U.S. Appl. No. 15/227,164, filed Aug. 3, 2016.
Office Action dated Nov. 3, 2017, in U.S. Appl. No. 15/227,164, filed Aug. 3, 2016.
Response to Final Office Action dated Oct. 29, 2018, U.S. Appl. No. 15/227,164.
Notice of Allowance dated Dec. 5, 2018, U.S. Appl. No. 15/227,164.

* cited by examiner

DETERMINING UNSIGNED NORMALIZED INTEGER REPRESENTATIONS OF A NUMBER IN DATA PROCESSING SYSTEMS

CROSS-REFERENCE TO RELATED APPLICATIONS

This application relates to the application GB 1513712.8 entitled "Data Processing Systems" filed on 3 Aug. 2015, to the application GB 1513716.9 entitled "Data Processing Systems" filed on 3 Aug. 2015, and to the application entitled "Data Processing Systems" filed on the same day with Ser. No. 15/227,164. The entire contents of these documents are incorporated herein by reference.

BACKGROUND

The technology described herein relates to data processing systems, and in particular to methods and apparatus for converting between different number representations in data processing systems.

Data processing systems, such as graphics processing systems, typically handle numbers using various different representations.

One common way in which a number can be represented in data processing systems is using the floating point representation, e.g. in accordance with the IEEE 754 Standard. The floating point representation of a number will typically include a sign, an exponent and a mantissa, and will have a certain precision such as 16-bit, 32-bit or 64-bit precision.

Another common way in which a number can be represented in data processing systems is using the unsigned normalized integer, or "unorm", representation, e.g. as defined in DirectX. In this case, a number between 0 and 1 is represented using an integer between 0 and $(2^b-1)$, where b is the number of bits, i.e. the precision, of the unorm representation. In other words, numbers in the range 0 to 1 are linearly mapped to integers in the range 0 to $(2^b-1)$, e.g. using rounding to the nearest integer.

In data processing systems, such as graphics processing systems, it is often necessary to convert between the various different number representations that are supported and used, and in particular to convert between the floating point representation of a number and the unorm representation of the number. This can arise, for example, in graphics processing systems where depth ("Z") values, colour values, etc., used in graphics processing operations can often be represented using both the floating point representation and the unorm representation.

When using rounding to the nearest integer, the value of a b-bit unorm representation U of a number x is given by the equation:

$$U=\mathrm{floor}(x\times(2^b-1)+0.5), \quad (1)$$

where the unorm representation U is clamped according to:
$U=2^b-1$ for $x \geq 1.0$, and
$U=0$ for $x \leq 0$,
i.e. the unorm representation U is set to its maximum for numbers greater than or equal to one, and is set to its minimum for numbers less than or equal to zero.

One way in which this conversion can be achieved in hardware utilizes the fact that equation (1) can be rewritten as:

$$U=\mathrm{floor}(x\times 2^b-x+0.5),$$

and can therefore be translated into hardware as a shift operation, a subtraction operation, an addition operation, and then a truncation (floor) operation.

However, this combination of operations is relatively expensive in hardware, e.g. in terms of the required on-chip area and/or the amount of processing required, and therefore the power consumption.

The Applicants therefore believe that there remains scope for improved techniques for converting between the floating point representation of a number and the unorm representation of the number in data processing systems.

BRIEF DESCRIPTION OF THE DRAWINGS

Various embodiments of the technology described herein will now be described by way of example only and with reference to the accompanying drawings, in which.

Like reference numerals are used for like components throughout the drawings, where appropriate.

DETAILED DESCRIPTION

Figure 1:
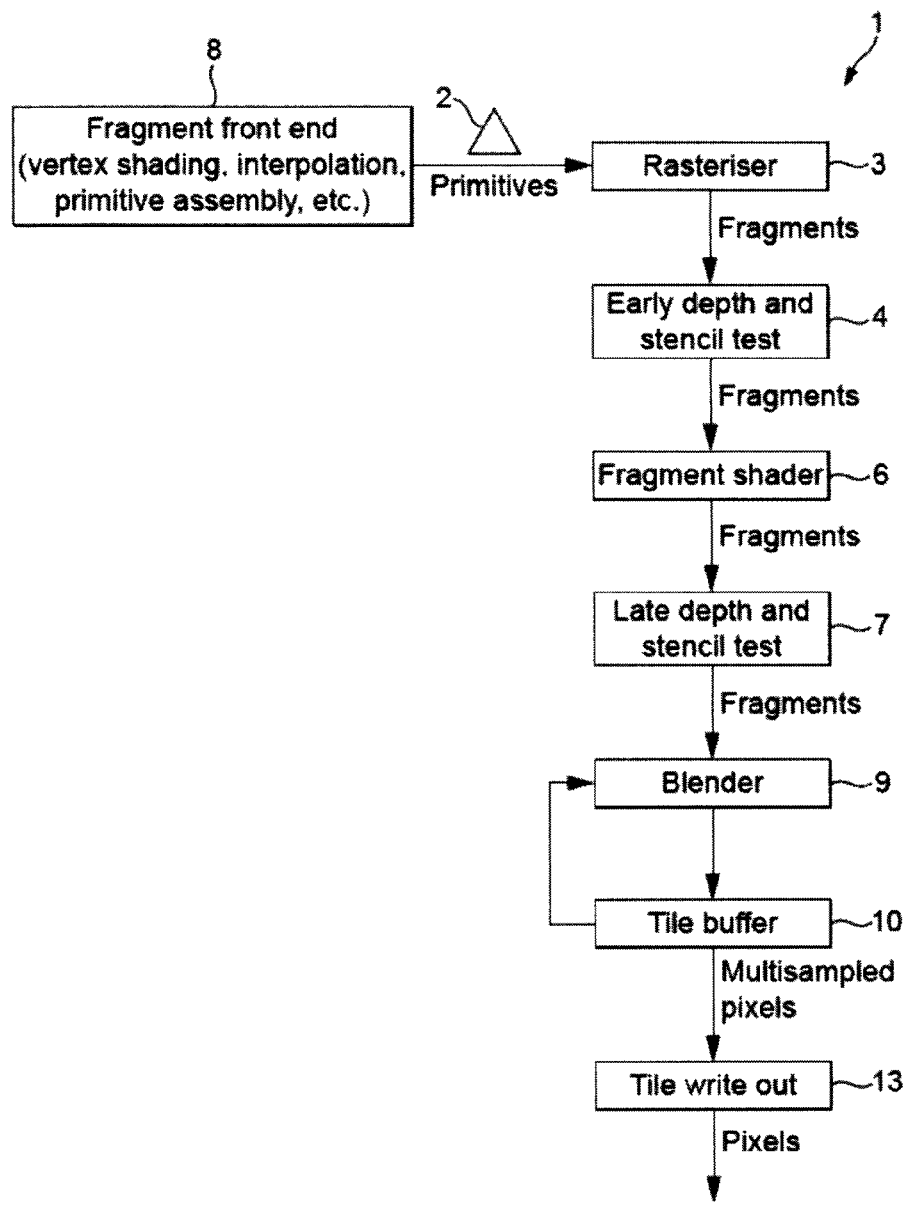
FIG. 1 shows schematically a graphics processing pipeline that can be operated in the manner of the technology described herein.

A first embodiment of the technology described herein comprises a method of operating a data processing system when determining a b-bit unsigned normalized integer representation U of a number x, the method comprising:

when the number x has a value between 0 and 1:

determining the integer part I of $(x \times 2^b)$; and determining whether to use the integer part I, an incremented version of the integer part I, or a decremented version of the integer part I for the unsigned normalized integer representation U of the number x based on a comparison that uses the fractional part F of $(x \times 2^b)$ and the number x.

A second embodiment of the technology described herein comprises apparatus for determining a b-bit unsigned normalized integer representation U of a number x that has a value between 0 and 1 to, comprising:

processing circuitry configured to determine the integer part I of $(x \times 2^b)$; and processing circuitry configured to determine whether to use the integer part I, an incremented version of the integer part I, or a decremented version of the integer part I for the unsigned normalized integer representation U of the number x based on a comparison that uses the fractional part F of $(x \times 2^b)$ and the number x.

The technology described herein is directed to a method and apparatus for determining an unsigned normalized integer ("unorm") representation U of a number x. In the technology described herein, if the number x has a (decimal) value between 0 and 1 (inclusive), in order to determine the b-bit unsigned normalized integer representation U of the number x, the integer part I of $(x \times 2^b)$ is determined, and then it is determined whether to use the integer part I, a decremented version of the integer part I, or an incremented version of the integer I for the unsigned normalized integer representation U of the number based on a comparison that uses the fractional part F of $(x \times 2^b)$ and the number x.

As will be discussed further below, the Applicants have recognised that this arrangement can be used to determine an unsigned normalized integer representation of a number in a particularly efficient manner, i.e. to facilitate more efficient and effective operation of the data processing system.

In particular, the Applicants have recognised that this arrangement can be (and in an embodiment is) translated into hardware as one or more shift operations, one or more comparison operations, and then one or more addition/subtraction operations, and that this is significantly more efficient, e.g. in terms of the required on-chip area and/or the amount of processing required, and therefore the power consumption, than the known techniques. That is, these operations can be (and in an embodiment are) implemented in hardware in a relatively straightforward and efficient manner, i.e. using a relatively small amount of processing circuitry (i.e. chip area).

Accordingly, the technology described herein can be (and in an embodiment is) used to reduce the amount of (e.g. fixed function) processing circuitry (i.e. chip area) that is required for determining an unsigned normalized integer representation of a number and/or to make more efficient use of processing circuitry (i.e. chip area). As will be discussed in more detail below, in situations (such as in graphics processing) where this determination is performed frequently, the technology described herein can result in a significant saving in chip area and/or power consumption. This accordingly reduces the power consumption of the overall data processing system and/or allows the data processing system to perform more processing operations without increasing its power consumption.

The technology described herein can accordingly reduce the processing and power requirements of data processing systems where it is necessary to determine an unsigned normalized integer representation of a number, such as in data processing systems that support and use the unorm number representation format together with one or more other formats such as a floating point number representation format.

The technology described herein therefore results in the data processing system operating in a more efficient and effective manner.

The number x that is considered in the technology described herein may be any suitable number for which it is desired to determine an unsigned normalized integer representation.

The number x may be used to represent any kind of data in the data processing system. However, in an embodiment, the data processing system comprises a graphics processing system, and the number x is used to represent data in the graphics processing system, such as depth or values, or colour (e.g. RGB or RGBα) values, etc.

The number x may be (initially) defined and represented in the data processing system in any desired and suitable manner. However, in an embodiment, the number x is (initially) represented using a floating point representation. Accordingly, in an embodiment the method and apparatus are for converting from a floating point representation of a number x to an unsigned normalized integer representation U of the number x.

Thus, in an embodiment the method comprises a method of operating a data processing system when converting from a floating point representation of a number x to a b-bit unsigned normalized integer representation U of the number x. In an embodiment, the apparatus is for converting from a floating point representation of a number x to a b-bit unsigned normalized integer representation U of the number x.

The floating point representation of the number x in an embodiment includes at least an exponent and a mantissa, optionally together with a sign. Each of the exponent and the mantissa are in an embodiment respectively represented by a binary number which in an embodiment comprises plural bits, while the optional sign is in an embodiment represented by a single bit (i.e. a sign bit). Other arrangements would, of course, be possible.

The floating point representation of the number x may have any suitable and desired precision (number of bits), such as for example 16-bit (half), 32-bit (single), 64-bit (double), or 128-bit (quad) precision.

The floating point representation of the number x is in an embodiment a normalised floating point representation of the number x. Where the number representation of the number x is not normalised, it is in an embodiment normalised before being processed.

In an embodiment, the floating point representation of the number x is in accordance with the IEEE 754 Standard.

The unsigned normalized integer representation U of the number that is determined in the technology described herein should be (and in an embodiment is) an integer that represents the number x. The integer should have (and in an embodiment does have) a (decimal) value between 0 and $(2^b-1)$ (inclusive), where b is the number of bits, i.e. the precision, of the unsigned normalized integer representation.

In an embodiment, values of the number x in the range 0 to 1 are linearly mapped to unorm integers in the range 0 to $(2^b-1)$, in an embodiment using rounding to the nearest integer, and in an embodiment rounding half integers up. Thus, the determination of the unsigned normalized integer representation U of the number x according to the technology described herein is in an embodiment done according to equation (1) above (or any equivalents thereof).

It would also be possible to implement and use other desired and suitable schemes and/or rounding schemes. For example, it would be possible to round half integers down, to round half integers to the nearest even integer, or to round half integers to the nearest odd integer, etc.

Where half integers are rounded down, the determination of the unsigned normalized integer representation U of the number x may be done according to the equation (or any equivalents thereof):

$$U=\mathrm{floor}(x\times(2^b-1)+0.49999\ldots).$$

Where half integers are rounded to the nearest even or odd integer, the rounding may use the integer part I of $(x\times 2^b)$ to determine whether a half integer should be rounded up or down.

The unsigned normalized integer representation U of the number may have any suitable and desired precision b, such as for example 1-bit, 2-bit, 4-bit, 8-bit, 10-bit, 12-bit, 16-bit, 24-bit or 32-bit precision.

As discussed above, the methods of the technology described herein are performed when the number x has a value between 0 and 1 (inclusive). This is because the unsigned normalized integer representation is defined so as to only be capable of representing numbers between 0 and 1.

Values of the number x that fall outside of this range may be treated in any suitable and desired manner. For example, such values may be simply ignored, i.e. not processed, such that no unsigned normalized integer representation U is determined for such numbers. Alternatively, such values may be processed in the manner of the technology described herein, but then the result of that processing may be ignored (since such results will not be valid).

In an embodiment, where the number x has a value outside of the range 0 to 1, then an unsigned normalized integer representation of the number is in an embodiment determined, in an embodiment using clamping.

According to one such embodiment, the unsigned normalized integer representation U is subjected to clamping according to:

$U=2^b-1$ for $x>1.0$, and $U=0$ for $x<0$.

That is, for values of the number x greater than 1, the unsigned normalized integer representation U is in an embodiment clamped to (set to) its maximum value, i.e. ($2^b-1$), and for values of the number x less than 0, the unsigned normalized integer representation U is in an embodiment clamped to (set to) its minimum value, i.e. 0.

In an embodiment, the unsigned normalized integer representation U is subjected to clamping according to:

$U=2^1-1$ for $x\geq 1.0$, and $U=0$ for $x\leq 0$, as this can then reduce the amount of processing (and therefore the power consumption of the overall data processing system) required for the conversion (as will be described further below) since it may not then be necessary to perform the determination of the unsigned normalized integer representation of the technology described herein when the number x is equal to 1 or 0.

Other arrangements would, of course, be possible. For example, it would be possible to implement and use a mixture or combination of these two clamping schemes.

Thus, in an embodiment, the method of the technology described herein comprises: when the number x has a value that is greater than or equal to (or greater than) 1, clamping (and the data processing system is configured to clamp) the unsigned normalized integer representation U of the number x to a (first) selected, in an embodiment predefined, value, in an embodiment as described above; and when the number x has a value that is less than or equal to (or less than) 0, clamping (and the data processing system is configured to clamp) the unsigned normalized integer representation U of the number x to a (second) selected, in an embodiment predefined, value, in an embodiment as described above.

It will accordingly be appreciated that the method of the technology described herein in an embodiment further comprises a step of determining (and the data processing system is in an embodiment configured to determine) whether the number x is greater than or equal to (or greater than) 1 and/or determining whether the number x is less than or equal to (or less than) 0.

In an embodiment, when (if) it is determined that the number x is greater than or equal to (or greater than) 1, then the unsigned normalized integer representation U is in an embodiment clamped to (set to) its maximum value, i.e. in an embodiment to ($2^b-1$). Correspondingly, when (if) it is determined that the number x is less than or equal to (or less than) 0, then the unsigned normalized integer representation U is in an embodiment clamped to (set to) its minimum value, i.e. in an embodiment to 0.

Where (if) the unsigned normalized integer number U is clamped, then the unsigned normalized integer determination of the technology described herein can be (and in an embodiment is) omitted, since the clamping operation will in effect return the appropriate value for the unsigned normalized integer representation U. This can accordingly further reduce the amount of processing and the power use of the system.

On the other hand, when (if) it is determined that the number x is less than (or less than or equal to) 1 and is greater than (or greater than or equal to) 0, then the unsigned normalized integer representation U is in an embodiment determined in the manner described above.

Whether the number x is greater than or equal to (or greater than) 1 and/or whether the number x is less than or equal to (or less than) 0 can be determined in any suitable and desired manner.

In an embodiment, whether the number x is greater than or equal to (or greater than) 1 is determined by considering the exponent of the floating point representation of the number. The Applicants have recognised that this is a particularly simple and efficient way in which to make this determination, i.e. that may be implemented using a relatively small amount of (e.g. fixed function) processing circuitry (i.e. chip area) and/or using processing circuitry in a more efficient manner.

In these embodiments, where (if) the exponent is larger than or equal to zero, then it is in an embodiment determined that the number x is greater than or equal to 1. Correspondingly, where (if) the exponent is less than zero, then it is in an embodiment determined that the number x is less than 1. (In these embodiments, where the exponent of the floating point representation of the number x is stored using an exponent bias (as is the case, e.g., in the IEEE 754 Standard), then the exponent to be used is in an embodiment determined from the stored exponent value by appropriately applying the exponent bias.)

Equally, in an embodiment, whether the floating point number x is less than or equal to (or less than) 0 may be determined by considering the sign bit (where present) of the floating point number x. Again, the Applicants have recognised that this is a particularly simple and efficient way in which to make this determination, i.e. that may be implemented using a relatively small amount of (e.g. fixed function) processing circuitry (i.e. chip area) and/or using processing circuitry in a more efficient manner.

In these embodiments, where (if) the sign bit indicates that the number x is negative, then it is in an embodiment determined that number x is less than zero. Correspondingly, where (if) the sign bit indicates that the number x is positive, then it is in an embodiment determined that the number x is greater than or equal to zero.

Other techniques for making these determinations would, of course, be possible.

As discussed above, in the unsigned normalized integer determination of the technology described herein, the integer part I of $(x \times 2^b)$ is determined. That is, the integer part I of the product of the number x with two raised to the power b (where b is the desired precision of the unsigned normalized integer representation U, as discussed above) is in an embodiment determined. In other words, the largest integer I not greater than $(x \times 2^b)$, i.e. $I=\mathrm{floor}(x \times 2^b)$, is in an embodiment determined. The integer part I of $(x \times 2^b)$ may be determined in any suitable and desired manner.

In an embodiment, the value $(x \times 2^b)$ is firstly determined, and the integer part I of $(x \times 2^b)$ is in an embodiment then determined from the value $(x \times 2^b)$.

In an embodiment, the binary version of the value $(x \times 2^b)$ is determined by appending b zeros to the binary representation of the mantissa of the floating point representation of the number x (and optionally by (where necessary) appropriately applying the exponent of the floating point representation of the number x, e.g. and in an embodiment by shifting the value (e.g. and in an embodiment to the right) by an appropriate number of bits corresponding to the exponent). That is, the value $(x \times 2^b)$ is in an embodiment determined by shifting the binary representation of the mantissa of the floating point representation of the number x by an appropriate number of bits corresponding to the number of bits b (the precision of the unorm representation being used)

(optionally as well as by an appropriate number of bits corresponding to the exponent).

The integer part I of $(x \times 2^b)$ is in an embodiment (then) determined by selecting the first b bits of the binary representation of the value $(x \times 2^b)$.

(In these embodiments (and other embodiments described herein), where the mantissa of the floating point representation of the number is handled or stored without the implicit bit (as is the case, e.g., in the IEEE 754 Standard), then the implicit bit is in an embodiment appended to the mantissa before it is used, as appropriate.)

It would also be possible to determine the integer part I of $(x \times 2^b)$ from a shifted version of binary representation of the value $(x \times 2^b)$ (and in an embodiment, this is done). Accordingly, in one embodiment the integer part I of $(x \times 2^b)$ is determined by selecting the first b bits of a shifted version of the binary representation of the value $(x \times 2^b)$ (i.e. by selecting the first b bits of a shifted version of the binary representation of the mantissa of the floating point representation of the number x with b appended zeros). In these embodiments, the manner in which this value is shifted may be selected as desired, e.g. to optimise the hardware implementation (as described further below) or otherwise.

It would also be possible in some cases to determine the integer part I of $(x \times 2^b)$ by selecting the first b bits of the binary representation of the mantissa of the floating point representation of the number x (e.g. without firstly appending b zeros to (or otherwise shifting) the binary representation of the mantissa of the floating point representation of the number x).

(Again, in these embodiments (and other embodiments described herein), where the exponent of the floating point representation of the number x is stored using an exponent bias (as is the case, e.g., in the IEEE 754 Standard), then the exponent to be used (applied) (e.g. in the manner described above) is in an embodiment determined from the stored exponent value by appropriately applying the exponent bias (e.g. by appropriately applying the exponent bias to the stored exponent before the biased exponent is then applied to the respective values to e.g. shift the respective values as described above).)

Thus, it will be appreciated that the step of determining the integer part I of $(x \times 2^b)$ in accordance with an embodiment can effectively be (and in an embodiment is) implemented in hardware as one or more shift operations. That is, in an embodiment, determining the integer part I of $(x \times 2^b)$ in an embodiment comprises using one or more shift operations to determine the integer part I of $(x \times 2^b)$.

As discussed above, in the technology described herein it is determined whether to use the integer part I, an incremented version of the integer part I, or a decremented version of the integer part I for the unsigned normalized integer representation U of the number x. The so-determined value is in an embodiment then used for the unsigned normalized integer representation U of the number x.

That is, in an embodiment, either (i) the integer part I of $(x \times 2^b)$ is used for the unsigned normalized integer representation U of the number x, i.e. U=I; (ii) an incremented version of the integer part I, in an embodiment the integer part I incremented by one, is used for the unsigned normalized integer representation U of the number x, i.e. U=I+1; or (iii) a decremented version of the integer part I, in an embodiment the integer part I decremented by one, is used for the unsigned normalized integer representation U of the number x, i.e. U=I−1.

In this regard, the Applicants have recognised (as will be described in more detail below) that the appropriate value of the unsigned normalized integer representation U of the number x (i.e. according to equation (1) above) can only ever take one of these values (i.e. one of I, I+1 and I−1), and moreover that a relatively simple comparison (i.e. the comparison of the technology described herein that uses the fractional part F of $(x \times 2^b)$ and the number x) can be (and in an embodiment is) used to determine which of these options should be selected in order to determine the appropriate value for the unsigned normalized integer representation U of the number x.

Moreover, determining the unsigned normalized integer representation U of the number in this way can effectively be (and in an embodiment is) implemented in hardware as one or more comparison operations, in an embodiment together with one or more incrementing and/or decrementing addition and/or subtraction operations. That is, in an embodiment, the unsigned normalized integer representation U of the number x may be (and in an embodiment is) determined using one or more comparison operations, in an embodiment together with one or more incrementing and/or decrementing addition and/or subtraction operations.

The Applicants have recognised that this arrangement, in an embodiment together with the one or more shift operation described above, represents a particularly efficient method for determining an unsigned normalized integer representation of a number, e.g. in terms of the required on-chip area and/or the amount of processing required, and therefore the power consumption, i.e. that may be implemented using a relatively small amount of (e.g. fixed function) processing circuitry (i.e. chip area) and/or using processing circuitry in a more efficient manner.

In an embodiment, where (if) it is determined to (i) use the integer part I of $(x \times 2^b)$ for the unsigned normalized integer representation U of the number, i.e. U=I, then the integer part I of $(x \times 2^b)$ is in an embodiment returned, i.e. as the final unsigned normalized integer representation U of the number x. Where (if) it is determined to (ii) use the integer part I of $(x \times 2^b)$ incremented by one for the unsigned normalized integer representation U of the number, i.e. U=I+1, then the integer part I of $(x \times 2^b)$ is in an embodiment incremented by one, and this incremented value is in an embodiment returned, i.e. as the final unsigned normalized integer representation U of the number x. Where (if) it is determined to the comparison to (iii) use integer part I of $(x \times 2^b)$ decremented by one for the unsigned normalized integer representation U of the number, i.e. U=I−1, then the integer part I of $(x \times 2^b)$ is in an embodiment decremented by one, and this decremented value is in an embodiment returned, i.e. as the final unsigned normalized integer representation U of the number x.

As discussed above, in the technology described herein, the determination as to whether to use the integer part I, an incremented version of the integer part I, or a decremented version of the integer part I is made based on a comparison that uses the fractional part F of $(x \times 2^b)$ and the number x. In embodiments where the number x is (initially) represented using the floating point representation (as discussed above), then the comparison of the technology described herein in an embodiment uses the fractional part F of $(x \times 2^b)$ and the floating point representation of the number x.

The comparison may be made using the "true" binary representations of the fractional part F of $(x \times 2^b)$ and the number x. However, in an embodiment, the comparison uses shifted versions of the fractional part F of $(x \times 2^b)$ and the number x, where the values are in an embodiment shifted in a corresponding manner (i.e. by the same amount).

Thus, in an embodiment, the fractional part F of $(x \times 2^b)$ or a shifted version of the fractional part F of $(x \times 2^b)$ is determined. That is, (a shifted version of) the fractional part F of the product of the number x with two raised to the power b is in an embodiment determined. In other words, (a shifted version of) the remainder of $(x \times 2^b)$ minus the integer part I of $(x \times 2^b)$, i.e. $F=\text{frac}(x \times 2^b)=(x \times 2^b)-I$, is in an embodiment determined.

The (shifted version of the) fractional part F of $(x \times 2^b)$ is in an embodiment determined by selecting the remaining bits of the (shifted version of the) binary representation of the value $(x \times 2^b)$, i.e. the bits of the (shifted version of the) binary representation of the value $(x \times 2^b)$ that follow the first b bits. Where appropriate, the so-determined value may be used as the (shifted version of the) fractional part F of $(x \times 2^b)$, or where necessary the so-determined value may be shifted to determine the appropriate (shifted version of the) fractional part F of $(x \times 2^b)$ to be used. In one embodiment, the version of the fractional part F of $(x \times 2^b)$ (that is used in the comparison) is determined by appending b zeros to the bits of the (shifted version of the) binary representation of the value $(x \times 2^b)$ that follow the first b bits.

Correspondingly, where a shifted version of the number x is used in the comparison, a shifted version of the binary representation of the value $(x \times 2^b)$, i.e. a shifted version of the binary representation of the mantissa of the floating point representation of the number x with b appended zeros, is in an embodiment used.

The comparison may comprise any suitable and desired such comparison, and may use the (shifted version of the) fractional part F and the (shifted version of the) number x in any suitable and desired manner. A single comparison may be made, or multiple different comparisons may be made.

In an embodiment, one or more different comparisons are made depending on the value of the number x.

In an embodiment, where the number x is greater than 0.5, i.e. where $x>0.5$, then the comparison in an embodiment comprises comparing (a shifted version of) the fractional part F of $(x \times 2^b)$ with (a shifted version of) the number x minus 0.5, i.e. comparing F with $(x-0.5)$ (or any equivalents thereof). In an embodiment, where the number x is greater than 0.5, i.e. $x>0.5$, then the comparison comprises determining whether (the shifted version of the) number x minus 0.5 is greater than the (shifted version of the) fractional part F of $(x \times 2^b)$, i.e. determining whether $(x-0.5)>F$ (or any equivalents thereof).

In this embodiment, where (if) it is determined that the number x minus 0.5 is greater than the fractional part F of $(x \times 2^b)$, i.e. $(x-0.5)>F$ (and $x>0.5$), then the integer part I of $(x \times 2^b)$ decremented by one is in an embodiment used for the unsigned normalized integer representation U of the number, i.e. $U=I-1$ (in an embodiment as described above). Where (if) it is determined that the number x minus 0.5 is other than (not) greater than the fractional part F of $(x \times 2^b)$, i.e. $(x-0.5) \leq F$ (and $x>0.5$), then the integer part I of $(x \times 2^b)$ is in an embodiment used for the unsigned normalized integer representation U of the number, i.e. $U=I$ (in an embodiment as described above).

In this regard, the Applicants have recognised that where the number x is greater than 0.5, i.e. where $x>0.5$, the appropriate value for the unsigned normalized integer representation U of the number (i.e. according to equation (1) above) can only ever take one of these two values (i.e. one of I and I−1), and moreover that the comparison of an embodiment between the fractional part F of $(x \times 2^b)$ and the number x minus 0.5, i.e. between F and $(x-0.5)$ (or any equivalents thereof) can be (and in an embodiment is) used to determine which of these options should be selected in order to determine the appropriate value for the unsigned normalized integer representation U of the number x.

This is because, as recognised by the Applicants, equation (1) can be rewritten as:

$$U=\text{floor}(I+F-x+0.5),$$

and the maximum possible value for the quantity $(F-x+0.5)$ is $1.499\ldots$, i.e. when $F=0.999\ldots$ and $x=0$, while the minimum possible value is $-0.5$, i.e. when $F=0$ and $x=1.0$. It can therefore be seen that the unsigned normalized integer representation U of the number can take the values (a) $U=I+1$ when $(F-x+0.5) \geq 1$, (b) $U=I$ when $(F-x+0.5) \geq 0$, and (c) $U=I-1$ when $(F-x+0.5)<0$.

Furthermore, where $x>0.5$, the condition (a) can never be satisfied since $(-x+0.5)<0$ and $F<1.0$, and so the integer I itself should be used for the unsigned normalized integer representation U of the number (i.e. $U=I$), or the integer I should be decremented by one where condition (c) is satisfied (i.e. $U=I-1$). Condition (c) can be rewritten to: $(x-F-0.5)>0$; and $(x-0.5)-F>0$. Setting $c=(x-0.5)$, then the condition (c) becomes $c>F$, i.e. the integer I should be (and in an embodiment is) decremented when $x>0.5$ and $c>F$.

In an embodiment, where the number x is less than 0.5, i.e. where $x<0.5$, then the comparison comprises comparing (a shifted version of) the fractional part F of $(x \times 2^b)$ with (a shifted version of) the number x plus 0.5, i.e. comparing F with $(x+0.5)$ (or any equivalents thereof). In an embodiment, where the number x is less than 0.5, i.e. $x<0.5$, then the comparison comprises determining whether the (shifted version of the) number x plus 0.5 is less than or equal to the (shifted version of the) fractional part F of $(x \times 2^b)$, i.e. determining whether $(x+0.5) \leq F$ (or any equivalents thereof).

In this case, where (if) it is determined that the number x plus 0.5 is less than or equal to the fractional part F of $(x \times 2^b)$, i.e. $(x+0.5) \leq F$ (and $x<0.5$), then the integer part I of $(x \times 2^b)$ incremented by one is in an embodiment used for the unsigned normalized integer representation U of the number x, i.e. $U=I+1$ (in an embodiment as described above). Where (if) it is determined that the number x plus 0.5 is other than (not) less than or equal to the fractional part F of $(x \times 2^b)$, i.e. $(x+0.5)>F$ (and $x<0.5$), then the integer part I of $(x \times 2^b)$ is in an embodiment used for the unsigned normalized integer representation U of the number x, i.e. $U=I$ (in an embodiment as described above).

In this regard, the Applicants have recognised that where the number x is less than 0.5, i.e. where $x<0.5$, the appropriate value of the unsigned normalized integer representation U of the number x (i.e. according to equation (1) above) can only ever take one of these two values (i.e. one of I and I+1), and moreover that the comparison of an embodiment between the fractional part F of $(x \times 2^b)$ and the number x plus 0.5, i.e. between F and $(x+0.5)$ (or equivalents thereof) can be (and in an embodiment is) used to determine which of these options should be selected in order to determine the appropriate value for the unsigned normalized integer representation U of the number x.

This is because where $x<0.5$, the condition (c) above can never be satisfied since $(-x+0.5)>0$ and $F>0$, and so the integer I itself should be used for the unsigned normalized integer representation U of the number (i.e. $U=I$), or the integer I should be incremented by one where condition (a) is satisfied (i.e. $U=I+1$). Condition (a) can be rewritten as: $(F-x+0.5) \geq 1$; $F \geq (1-0.5+x)$; and $F \geq (0.5+x)$. Setting $d=(x+0.5)$, then the condition (a) becomes $d \leq F$, i.e. the integer I should be (and in an embodiment is) incremented by one when $x<0.5$ and $d \leq F$.

Thus, in an embodiment of the technology described herein, determining the unsigned normalized integer representation U of the number x comprises:

using a decremented version of the integer I for the unsigned normalized integer representation U of the number when x>0.5 and x−0.5>F;

using an incremented version of the integer I for the unsigned normalized integer representation U of the number when x<0.5 and x+0.5≤F; and otherwise using the integer part I for the unsigned normalized integer representation U of the number.

The integer part I is in an embodiment used for the unsigned normalized integer representation U of the number x where x>0.5 and x−0.5≤F, and/or where x<0.5 and x+0.5>F.

In an embodiment, where the number x is equal to 0.5, i.e. where x=0.5, then the integer part I of $(x \times 2^b)$ is in an embodiment used for the unsigned normalized integer representation U of the number, i.e. U=I (in an embodiment as described above). This is because where x=0.5, conditions (a) and (c) above can never be satisfied. In this case, the comparison of the technology described herein can be (and in an embodiment is) omitted (i.e. where x=0.5).

It will accordingly be appreciated that the method of the technology described herein in an embodiment further comprises one or more steps of determining (and the data processing system is in an embodiment configured to determine) whether the number x is equal to 0.5, whether the number x is greater than 0.5 and/or whether the number x is less than 0.5.

Where (if) it is determined that the number x is equal to 0.5, then the integer part I of $(x \times 2^b)$ is in an embodiment returned, i.e. as the final unsigned normalized integer representation U of the number x. Where (if) it is determined that the number x is greater than 0.5, then the comparison of the technology described herein in an embodiment comprises comparing the (shifted version of the) fractional part F of $(x \times 2^b)$ with the (shifted version of the) number x minus 0.5 (as described above). Where (if) it is determined that the number x is less than 0.5, then the comparison of the technology described herein in an embodiment comprises comparing the (shifted version of the) fractional part F of $(x \times 2^b)$ with the (shifted version of the) number x plus 0.5 (as described above).

Alternatively, the determination of whether the number x is equal to 0.5 may be merged with the determination of whether the number x is less than 0.5. That is, the method may in an embodiment comprise one or more steps of determining (and the data processing system may be configured to determine) whether the number x is greater than 0.5 and/or whether the number x is less than or equal to 0.5. In this case, where (if) it is determined that the number x is less than or equal to 0.5, then the comparison of the technology described herein in an embodiment comprises comparing the (shifted version of the) fractional part F of $(x \times 2^b)$ with the (shifted version of the) number x plus 0.5 (as described above).

Whether or not the number x is equal to 0.5 can be determined in any suitable and desired manner. For example, the number x could simply be compared with 0.5. However, in an embodiment, this determination is made by inverting ("flipping") the bit of the (shifted version of the) binary representation of the value $(x \times 2^b)$ that represents the value 0.5 (i.e. the bit that corresponds to $2^{-1}$) (i.e. inverting the bit that represents the value 0.5 of the (shifted version of the) binary representation of the mantissa of the floating point representation of the number x with b appended zeros), and then comparing the resulting value (i.e. the value of (the shifted version of the) binary representation of the value $(x \times 2^b)$ having its bit that represents the value 0.5 inverted) with zero.

As will be appreciated by those having skill in the art, since according to an embodiment the number x will have a value between 0 and 1, then the bit of the (shifted version of the) binary representation of the value $(x \times 2^b)$ that represents the value of 0.5 will be the most significant bit. Thus, in an embodiment, the determination is made by inverting ("flipping") the most significant bit of the (shifted version of the) binary representation of the value $(x \times 2^b)$, and then comparing the resulting value (i.e. the (shifted version of the) binary representation of the value $(x \times 2^b)$ having its most significant bit inverted) with zero.

When (if) this value is equal to zero, then it is in an embodiment determined that the number x is equal to 0.5 (i.e. x=0.5). When (if) this value is other than (i.e. not) equal to zero, then it is in an embodiment determined that the number x is other than (i.e. not) equal to 0.5 (i.e. x≠0.5). As will be appreciated by those having skill in the art, this represent a particularly simple and efficient way in which it can be determined whether or not the number x is equal to 0.5, i.e. that may be implemented using a relatively small amount of (e.g. fixed function) processing circuitry (i.e. chip area) and/or using processing circuitry in a more efficient manner.

Correspondingly, whether the number x is greater than 0.5 and/or whether the number x is less than 0.5 may be determined in any suitable and desired manner. In one embodiment, this is done using the value of the bit of the (shifted version of the) binary representation of the value $(x \times 2^b)$ that represents the value 0.5 (i.e. the bit that corresponds to $2^{-1}$, and in an embodiment the most significant bit) (i.e. using the value of the bit that represents the value 0.5 of the (shifted version of the) binary representation of the mantissa of the floating point representation of the number x with b appended zeros), e.g. and in an embodiment by examining the value of this bit. As will be appreciated by those having skill in the art, since the value of the number x is constrained to be within 0 and 1 in these embodiments of the technology described herein, where this bit is equal to zero then the value of the number x will be less than 0.5, whereas where this bit is equal to one then the value of the number x will be greater than or equal to 0.5.

Thus, in an embodiment, where (if) it is determined that the value of the bit of the (shifted version of the) binary representation of the value $(x \times 2^b)$ that represents the value of 0.5 (i.e. the bit that corresponds to $2^{-1}$, and in an embodiment the most significant bit) is equal to zero, then it is determined that the number x is less than 0.5. Where (if) it is determined that the value of the bit of the (shifted version of the) binary representation of the value $(x \times 2^b)$ that represents the value of 0.5 (i.e. the bit that corresponds to $2^{-1}$, and in an embodiment the most significant bit) is equal to one, then it is in an embodiment determined that the number x is greater than or equal to 0.5. Where (if) it is determined that the value of the bit of the (shifted version of the) binary representation of the value $(x \times 2^b)$ that represents the value of 0.5 (i.e. the bit that corresponds to $2^{-1}$, and in an embodiment the most significant bit) is equal to one and it is determined that the value of the number x is other than (not) equal to 0.5 (e.g. as described above), then it is in an embodiment determined that the number x is greater than 0.5.

It would also be possible to determine (and in one embodiment it is determined) whether the number x is greater than 0.5 and/or whether the number x is less than 0.5 using the inverted ("flipped") value of the bit of the (shifted version of the) binary representation of the value of $(x \times 2^b)$ that represents the value of 0.5 (i.e. the bit that corresponds to $2^{-1}$, and in an embodiment the most significant bit), e.g. and in an embodiment by examining the value of this inverted bit, e.g. in the manner described above (mutatis mutandis).

As described above, in an embodiment it is determined whether to use the integer part I, an incremented version of the integer part I, or a decremented version of the integer part I for the unsigned normalized integer representation U of the number x based on one comparison for x>0.5 (i.e. a comparison between (x−0.5) and F) and a different comparison for x<0.5 or x≤0.5 (i.e. a comparison between (x+0.5) and F).

The Applicants have furthermore recognised that both of these comparisons (i.e. for x>0.5 and x<0.5 or x≤0.5) can be (and in an embodiment are) implemented using a single comparison stage or operation. As will be appreciated by those having skill in the art, this represents a further optimisation of the method and apparatus for determining the unsigned normalized integer representation U of a number x, i.e. that may be implemented using a relatively small amount of (e.g. fixed function) processing circuitry (i.e. chip area) and/or using processing circuitry in a more efficient manner.

In an embodiment, the single comparison stage or operation uses the value of the (shifted version of the) binary representation of the value $(x \times 2^b)$ having its bit that represents the value 0.5 (in an embodiment the most significant bit) inverted. This value may be determined specifically for this purpose, or in an embodiment the value as obtained in the operations described above can be used.

As will be appreciated by those having skill in the art, the effect of inverting the bit of the (shifted version of the) binary representation of the value $(x \times 2^b)$ that represents the value of 0.5 (in an embodiment the most significant bit) will be to add or subtract (a shifted version of) 0.5 from the (shifted version of the) number x.

For values of the number x that are greater than 0.5, the bit that is inverted will initially be set to 1, whereas for values of the number x that are less than 0.5, this bit will initially be set to 0. Thus, for values of the number x that are greater than 0.5, the effect of inverting this bit will be to subtract (a shifted version of) 0.5 from (a shifted version of) the number x, while for values of the number x that are less than 0.5, the effect of inverting this bit will be to add (a shifted version of) 0.5 to (a shifted version of) the number x.

The Applicants have recognised that, conveniently, the so-determined values correspond to the above values which are to be compared to the (shifted version of the) fractional part F of $(x \times 2^b)$. That is for x>0.5 the so-determined value will be (a shifted version of) (x−0.5), and for x<0.5 the so-determined value will be (a shifted version of) (x+0.5).

Thus, in an embodiment, (a shifted version of) the binary representation of the value $(x \times 2^b)$ having its bit that represents the value 0.5 (in an embodiment the most significant bit) inverted is in an embodiment used in the comparison of the technology described herein. In an embodiment, (a shifted version of) the binary representation of the value $(x \times 2^b)$ having its bit that represents the value 0.5 (in an embodiment the most significant bit) inverted is compared to (a shifted version of) the fractional part F of $(x \times 2^b)$.

Where (if) (the shifted version of) the binary representation of the value $(x \times 2^b)$ having its bit that represents the value 0.5 (in an embodiment the most significant bit) inverted is greater than (the shifted version of) F and where x>0.5 (e.g. where the bit that represents the value of 0.5 (in an embodiment the most significant bit) is equal to one), then the decremented version of the integer I should be (and in an embodiment is) used for the unsigned normalized integer representation U of the number x. Where (if) this value is other than (i.e. not) greater than (the shifted version of) F and where x<0.5 (e.g. where the bit that represents the value of 0.5 (in an embodiment the most significant bit) is equal to zero), then the incremented version of the integer I should be (and in an embodiment is) used for the unsigned normalized integer representation U of the number x. Otherwise, the integer I should be (and in an embodiment is) used for the unsigned normalized integer representation U of the number x.

As will be appreciated by those having skill in the art, this represents a particularly simple and efficient method for determining the unsigned normalized integer representation U of the number x, i.e. that may be implemented using a relatively small amount of (e.g. fixed function) processing circuitry (i.e. chip area) and/or using processing circuitry in a more efficient manner.

As described above, in an embodiment of the technology described herein, the unsigned normalized integer representation U of a number is determined using one or more shift operations, one or more comparison operations, and one or more addition (or subtraction) operations that in an embodiment increment or decrement an integer by one. It is believed that this arrangement is new and advantageous in its own right.

Thus, another embodiment of the technology described herein comprises a method of determining an unsigned normalized integer representation U of a number x, the method comprising:

using one or more shift operations, one or more comparison operations, and one or more addition operations to determine an unsigned normalized integer representation U of the number x.

Another embodiment of the technology described herein comprises apparatus for determining an unsigned normalized integer representation U of a number, comprising:

a shifter, a comparator and an adder;

wherein the shifter, the comparator and the adder are configured to determine an unsigned normalized integer representation U of a number.

As will be appreciated by those skilled in the art, these embodiments of the technology described herein can, and in an embodiment do, include any one or more or all of the optional features of the technology described herein described herein, as appropriate.

Thus, for example, the one or more shift operations (and the shifter) are in an embodiment used to determine the integer part I and/or the fractional part F of $(x \times 2^b)$, e.g. and in an embodiment as described above.

Thus, the shifter is in an embodiment operable to receive the binary representation of the mantissa of the floating point representation of the number x, and in an embodiment to then append b zeros to the binary representation of the mantissa of the floating point representation of the number x, i.e. to shift the binary representation of the mantissa of the floating point representation of the number x by an appropriate number of bits corresponding to the number of bits b (the precision of the unorm representation being used).

The shifter is also in an embodiment operable to (where necessary) appropriately shift the binary representation of the mantissa with b appended zeros, e.g. so as to apply the exponent of the floating point representation of the number x or otherwise.

The one or more comparison operations (and the comparator) are in an embodiment used to determine whether to use the integer part I, an incremented version of the integer part I, or a decremented version of the integer part I for the unsigned normalized integer representation U of the number x. The one or more comparison operations in an embodiment use (a shifted version of) the fractional part F and (a shifted version of) the value $(x \times 2^b)$, e.g. and in an embodiment as described above.

The one or more addition operations in an embodiment comprise (and the adder is in an embodiment operable to perform) one or more incrementing or decrementing addition or subtraction operations that in an embodiment increment or decrement the integer part I by one, e.g. and in an embodiment as described above. In one embodiment, the adder may comprise an adder-subtractor.

Thus, the comparator is in an embodiment operable to compare (a shifted version of) the bits of the binary representation of the mantissa of the floating point representation of the number x with b appended zeros having its bit that represents the value 0.5 (in an embodiment the most significant bit) inverted (i.e. a (shifted version of) binary representation of the value $(x \times 2^b)$ having its bit that represents the value 0.5 (in an embodiment the most significant bit) inverted) to the (shifted version of the) bits of the binary representation of the mantissa of the floating point representation of the number x with b appended zeros that follow the first b bits (i.e. to the (shifted version of the) binary representation of the fractional part F of $(x \times 2^b)$).

Where (if) the comparator determines that the value of the (shifted version of the) binary representation of the value $(x \times 2^b)$ having its bit that represents the value 0.5 (in an embodiment the most significant bit) inverted is greater than the (shifted version of the) bits of the binary representation of the mantissa with b appended zeros that follow the first b bits (i.e. to the (shifted version of the) binary representation of F) (and where x>0.5, e.g. where the bit that represents the value 0.5 (in an embodiment the most significant bit) is equal to one), then the adder in an embodiment decrements the (shifted version of the) first b bits of the binary representation of the mantissa of the floating point representation of the number x with b appended zeros (i.e. the binary representation of the integer part I of $(x \times 2^b)$) by one (and the decremented version of the integer I is used for the unsigned normalized integer representation U of the number x).

Where (if) the comparator determines that this value is other than (i.e. not) greater than the (shifted version of) bits of the binary representation of the mantissa with b appended zeros that follow the first b bits (i.e. the (shifted version of the) binary representation of F) (and where x<0.5, e.g. where the bit that represents the value 0.5 (in an embodiment the most significant bit) is equal to zero), then the adder in an embodiment increments the (shifted version of the) first b bits of the binary representation of the mantissa of the floating point representation of the number x with b appended zeros (i.e. the binary representation of the integer part I of $(x \times 2^b)$) by one (and the incremented version of the integer I is used for the unsigned normalized integer representation U of the number x).

Otherwise, then the (shifted version of the) first b bits of the binary representation of the mantissa of the floating point representation of the number x with b appended zeros (i.e. the binary representation of the integer I) is in an embodiment used for the unsigned normalized integer representation U of the number x.

Thus, in an embodiment, the apparatus is configured to determine a b-bit unsigned normalized integer representation U of a number x from a floating point representation of the number x; and the shifter is configured to, when the number x has a value between 0 and 1, receive the binary representation of the mantissa of the floating point representation of the number x and shift the binary representation of the mantissa of the floating point representation of the number x;

the comparator is operable to compare (a shifted version of) the binary representation of the mantissa of the floating point representation of the number x with b appended zeros having its bit that represents the value 0.5 (in an embodiment the most significant bit) inverted to the (shifted version of the) bits that follow the first b bits of the binary representation of the mantissa of the floating point representation of the number x with b appended zeros produced by the shifter, and to output the result of the comparison to the adder; and the adder is operable to provide as the unsigned normalized integer representation U of the number x, one of: the (shifted version of the) top b-bits of the binary representation of the mantissa of the floating point representation of the number x with b appended zeros generated by the shifter; that value incremented by 1; and that value decremented by 1, in response to the output of the comparator.

The Applicants have found that this arrangement represents a particularly efficient method for determining an unsigned normalized integer representation of a number, e.g. in terms of the required on-chip area and/or the amount of processing required, and therefore the power consumption. This is because the combination of (shift, comparison and addition) operations can be (and in an embodiment is) implemented in hardware using a relatively small amount of (e.g. fixed function) processing circuitry (i.e. chip area). These embodiments therefore result in the overall data processing system operating in a more efficient and effective manner.

Once it has been determined, the unsigned normalized integer representation U of the number x may be used as desired.

Correspondingly, the technology described herein can be implemented in any arrangement or situation in which it is required to determine a unorm representation of a number.

For example, the technology described herein can be implemented in the situation where depth values are processed (internally) (e.g. by a graphics processor) using the floating point representation, but are stored (e.g. in a depth buffer) using the unorm representation. Equally, the technology described herein can be implemented in the situation where colour values (e.g. RGB or RGB a components) are processed (internally) (e.g. by a graphics processor) using the floating point representation, but are stored (e.g. in a tile or frame buffer) using the unorm representation.

In these situations, when it is desired to write a depth or colour value to a depth/tile buffer or to memory, the floating point representation of the depth or colour value is in an embodiment converted to a unorm representation of the depth or colour value, e.g. in accordance with the technology described herein. The determined unsigned normalized integer representation U of the depth or colour value is in an embodiment then stored.

Equally, in these situations, where it is desired to compare a (e.g. newly generated) floating point depth or colour value with a stored (unorm) depth or colour value, the floating point representation of the (new) depth or colour value is in an embodiment converted into a unorm representation of the depth or colour value, and then compared with the stored depth or colour value, as appropriate.

Thus, in an embodiment the method comprises a method of operating a data processing system when converting from a floating point representation of a depth or colour value to a b-bit unsigned normalized integer representation U of the depth or colour value. In an embodiment, the apparatus is for converting from a floating point representation of a depth or colour value to a b-bit unsigned normalized integer representation U of the depth or colour value.

In an embodiment, the data processing system (in an embodiment a graphics processing system) generates and/or processes a (respective) floating point representation of one or more (e.g. colour and/or depth) values in respect of a render output (e.g. an image, frame or tile to be displayed, a texture, etc.), for each of one or more, and in an embodiment for each, of the one or more values, converts the floating point representation of the value to an unsigned normalized integer representation U of the (respective) (depth or colour) value (in accordance with the technology described herein), and stores the unsigned normalized integer representation U of the (depth or colour) value.

In another embodiment, the data processing system (in an embodiment a graphics processing system) generates and/or processes a (respective) floating point representation of one or more (e.g. colour and/or depth) values in respect of a render output (e.g. an image, frame or tile to be displayed, a texture, etc.), for each of one or more of, and in an embodiment for each of the one or more values, converts the floating point representation of the value to an unsigned normalized integer representation U of the (depth or colour) value (in accordance with the technology described herein), and compares the unsigned normalized integer representation U of the (depth or colour) value with one or more stored unsigned normalized integer (depth or colour) values. One or more or each of the one or more (depth or colour) values may then be further processed (in an embodiment for display), e.g. by the data processing system (e.g. graphics processing system), and/or stored or otherwise, e.g. depending on the result of the comparison.

In these embodiments, the one or more stored values may be further processed (in an embodiment for display), e.g. by the data processing system (e.g. graphics processing system), and/or provided to a display for display.

Thus, in an embodiment, the unsigned normalized integer representation U of the number x may be further processed, e.g. for display. In an embodiment, the unsigned normalized integer representation U of the number x may be used to provide an image for display, e.g. may be provided to a display for display.

In an embodiment, the method comprises a method of operating a graphics processing system, and the number x comprises a data (colour or depth) value for use in a graphics processing operation. In an embodiment, the method comprises: when generating a render output in a graphics processing system, processing one or more data values using a (respective) floating point representation to generate one or more floating point output data values, for each of one or more, and in an embodiment for each, of the one or more output data values, converting the floating point representation of the output data value to a unsigned normalized integer representation U of the output data value in the manner of the technology described herein, and storing the unsigned normalized integer representation U of the output data value.

Correspondingly, in an embodiment, the apparatus comprises a graphics processing system, and the number x comprises a data (colour or depth) value for use in a graphics processing operation by the graphics processing system. In an embodiment, the graphics processing system is configured to: when generating a render output, process one or more data values using a (respective) floating point representation to generate one or more floating point output data values, for each of one or more, and in an embodiment for each, of the one or more output data values convert the floating point representation of the output data value to an unsigned normalized integer representation U of the output data value in the manner of the technology described herein, and store the unsigned normalized integer representation U of the output data value.

In another embodiment, the method comprises a method of operating a graphics processing system, and the number x comprises a data (colour or depth) value for use in a graphics processing operation. In an embodiment, the method comprises: when generating a render output in a graphics processing system, processing one or more data values using a (respective) floating point representation to generate one or more floating point output data values, for each of one or more, and in an embodiment for each, of the one or more output data values, converting the floating point representation of the output data value to an unsigned normalized integer representation U of the output data value in the manner of the technology described herein, and comparing the unsigned normalized integer representation U of the output data value with one or more stored unsigned normalized integer data values.

Correspondingly, in an embodiment, the apparatus comprises a graphics processing system, and the number x comprises a data (colour or depth) value for use in a graphics processing operation by the graphics processing system. In an embodiment, the graphics processing system is configured to: when generating a render output, process one or more data values using a (respective) floating point representation to generate one or more floating point output data values, for each of one or more, and in an embodiment for each, of the one or more output data values, convert the floating point representation of the output data value to an unsigned normalized integer representation U of the output data value in the manner of the technology described herein, and compare the unsigned normalized integer representation U of the output data value with one or more stored unsigned normalized integer data values.

The technology described herein can be implemented in any suitable system, such as a suitably configured microprocessor based system. In an embodiment, the technology described herein is implemented in a computer and/or micro-processor based system.

The various functions of the technology described herein can be carried out in any desired and suitable manner. For example, the functions of the technology described herein can be implemented in hardware or software, as desired. Thus, for example, unless otherwise indicated, the various functional elements and "means" of the technology described herein may comprise a suitable processor or processors, controller or controllers, functional units, circuitry, processing logic, microprocessor arrangements, etc., that are operable to perform the various functions, etc., such as appropriately dedicated hardware elements and/or programmable hardware elements that can be programmed to operate in the desired manner.

It should also be noted here that, as will be appreciated by those skilled in the art, the various functions, etc., of the technology described herein may be duplicated and/or carried out in parallel on a given processor. Equally, the various processing stages may share processing circuitry, etc., if desired.

Furthermore, any one or more or all of the processing stages of the technology described herein may be embodied as processing stage circuitry, e.g., in the form of one or more fixed-function units (hardware) (processing circuitry), and/or in the form of programmable processing circuitry that can be programmed to perform the desired operation. Equally, any one or more of the processing stages and processing stage circuitry of the technology described herein may comprise a separate circuit element to any one or more of the other processing stages or processing stage circuitry, and/or any one or more or all of the processing stages and processing stage circuitry may be at least partially formed of shared processing circuitry.

The data processing system in an embodiment comprises a graphics processing system or graphics processing pipeline. Subject to any hardware necessary to carry out the specific functions discussed above, the graphics processing pipeline can otherwise include any one or more or all of the usual functional units, etc., that graphics processing pipelines include.

It will also be appreciated by those skilled in the art that all of the described embodiments of the technology described herein can, and in an embodiment do, include, as appropriate, any one or more or all of the features described herein.

The methods in accordance with the technology described herein may be implemented at least partially using software e.g. computer programs. It will thus be seen that when viewed from further embodiments the technology described herein comprises computer software specifically adapted to carry out the methods herein described when installed on a data processor, a computer program element comprising computer software code portions for performing the methods herein described when the program element is run on a data processor, and a computer program comprising code adapted to perform all the steps of a method or of the methods herein described when the program is run on a data processing system. The data processor may be a microprocessor system, a programmable FPGA (field programmable gate array), etc.

The technology described herein also extends to a computer software carrier comprising such software which when used to operate a graphics processor, renderer or microprocessor system comprising a data processor causes in conjunction with said data processor said processor, renderer or system to carry out the steps of the methods of the technology described herein. Such a computer software carrier could be a physical storage medium such as a ROM chip, CD ROM, RAM, flash memory, or disk, or could be a signal such as an electronic signal over wires, an optical signal or a radio signal such as to a satellite or the like.

It will further be appreciated that not all steps of the methods of the technology described herein need be carried out by computer software and thus from a further broad embodiment the technology described herein comprises computer software and such software installed on a computer software carrier for carrying out at least one of the steps of the methods set out herein.

The technology described herein may accordingly suitably be embodied as a computer program product for use with a computer system. Such an implementation may comprise a series of computer readable instructions either fixed on a tangible, non-transitory medium, such as a computer readable medium, for example, diskette, CD ROM, ROM, RAM, flash memory, or hard disk. It could also comprise a series of computer readable instructions transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink wrapped software, preloaded with a computer system, for example, on a system ROM or fixed disk, or distributed from a server or electronic bulletin board over a network, for example, the Internet or World Wide Web.

Embodiments of the technology described herein will now be described with reference to the figures.

When a computer graphics image is to be displayed, it is usually first defined as a series of primitives (polygons), which primitives are then divided (rasterised) into graphics fragments for graphics rendering in turn. During a normal graphics rendering operation, the renderer will modify the (e.g.) colour (red, green and blue, RGB) and transparency (alpha, a) data associated with each fragment so that the fragments can be displayed correctly. Once the fragments have fully traversed the renderer, then their associated data values are stored in memory, ready for output for display.

FIG. 1 shows schematically a graphics processing pipeline 1 that may operate in accordance with the technology described herein. The graphics processing pipeline 1 is a tiled deferred renderer with a fully programmable GPGPU context, for example a renderer which executes partly via Direct Compute, OpenCL, CUDA, etc.

As the graphics processing pipeline 1 shown in FIG. 1 is a tile-based renderer, it will thus produce tiles of a render output data array, such as an output frame to be generated.

(In tile-based rendering, rather than the entire render output, e.g., frame, effectively being processed in one go as in immediate mode rendering, the render output, e.g., frame to be displayed, is divided into a plurality of smaller sub-regions, usually referred to as "tiles". Each tile (sub-region) is rendered separately (typically one-after-another), and the rendered tiles (sub-regions) are then recombined to provide the complete render output, e.g., frame for display. In such arrangements, the render output is typically divided into regularly-sized and shaped sub-regions (tiles) (which are usually, e.g., squares or rectangles), but this is not essential. Each tile corresponds to a respective set of screen space sampling positions.)

The render output data array may typically be an output frame intended for display on a display device, such as a screen or printer, but may also, for example, comprise intermediate data intended for use in later rendering passes (also known as a "render to texture" output), etc.

FIG. 1 shows the main elements and pipeline stages of the graphics processing pipeline 1 that are relevant to the operation of the present embodiment. As will be appreciated by those skilled in the art there may be other elements of the graphics processing pipeline that are not illustrated in FIG.

1. It should also be noted here that FIG. 1 is only schematic, and that, for example, in practice the shown functional units and pipeline stages may share significant hardware circuits, even though they are shown schematically as separate stages in FIG. 1. It will also be appreciated that each of the stages, elements and units, etc., of the graphics processing pipeline as shown in FIG. 1 may be implemented as desired and will accordingly comprise, e.g., appropriate circuitry and/or processing logic, etc., for performing the necessary operation and functions.

FIG. 1 shows schematically the pipeline stages after the graphics primitives (polygons) 2 for input to the rasterization process have been generated. Thus, at this point the graphics data (the vertex data) has undergone fragment frontend operations 8, such as transformation operations (not shown), vertex shading, interpolation and a primitive set-up stage (not shown) to set-up the primitives to be rendered, in response to the commands and vertex data provided to the graphics processor.

As shown in FIG. 1, this part of the graphics processing pipeline 1 includes a number of stages, including a rasterization stage 3, an early Z (depth) and stencil test stage 4, a renderer in the form of a fragment shading stage 6, a late Z (depth) and stencil test stage 7, a blending stage 9, a tile buffer 10 and a downsampling and writeout (multisample resolve) stage 13.

The rasterization stage 3 of the graphics processing pipeline 1 operates to rasterize the primitives making up the render output (e.g. the image to be displayed) into individual graphics fragments for processing. To do this, the rasterizer 3 receives graphics primitives 2 for rendering, rasterizes the primitives to sampling points and generates graphics fragments having appropriate positions (representing appropriate sampling positions) for rendering the primitives.

The fragments generated by the rasterizer are then sent onwards to the rest of the pipeline for processing.

The early Z/stencil stage 4 performs a Z (depth) test on fragments it receives from the rasterizer 3, to see if any fragments can be discarded (culled) at this stage. To do this, it compares the depth values of (associated with) fragments issuing from the rasterizer 3 with the depth values of fragments that have already been rendered (these depth values are stored in a depth (Z) buffer that is part of the tile buffer 10) to determine whether the new fragments will be occluded by fragments that have already been rendered (or not). At the same time, an early stencil test is carried out.

Fragments that pass the fragment early Z and stencil test stage 4 are then sent to the fragment shading stage 6. The fragment shading stage 6 performs the appropriate fragment processing operations on the fragments that pass the early Z and stencil tests, so as to process the fragments to generate the appropriate rendered fragment data.

This fragment processing may include any suitable and desired fragment shading processes, such as executing fragment shader programs on the fragments, applying textures to the fragments, applying fogging or other operations to the fragments, etc., to generate the appropriate fragment data. In the present embodiment, the fragment shading stage 6 is in the form of a shader pipeline (a programmable fragment shader), but other arrangements, such as the use also or instead of fixed function fragment shading units would be possible, if desired.

There is then a "late" fragment Z and stencil test stage 7, which carries out, inter alia, an end of pipeline depth test on the shaded fragments to determine whether a rendered fragment will actually be seen in the final image. This depth test uses the Z-buffer value for the fragment's position stored in the Z-buffer in the tile buffers 10 to determine whether the fragment data for the new fragments should replace the fragment data of the fragments that have already been rendered, by comparing the depth values of (associated with) fragments issuing from the fragment shading stage 6 with the depth values of fragments that have already been rendered (as stored in the depth buffer). This late fragment depth and stencil test stage 7 also carries out any necessary "late" alpha and/or stencil tests on the fragments.

The fragments that pass the late fragment test stage 7 are then subjected to, if required, any necessary blending operations with fragments already stored in the tile buffer 10 in the blender 9. Any other remaining operations necessary on the fragments, such as dither, etc. (not shown) are also carried out at this stage.

Finally, the (blended) output fragment data (values) are written to the tile buffer 10 from where they can, for example, be output to a frame buffer for display. The depth value for an output fragment is also written appropriately to a Z-buffer within the tile buffer 10. (The tile buffer will store colour and depth buffers that store appropriate colour, etc., values or a Z-value, respectively, for each sampling position that the buffers represent (in essence for each sampling position of a tile that is being processed).) These buffers store an array of fragment data that represents part (a tile) of the overall render output (e.g. image to be displayed), with respective sets of sample values in the buffers corresponding to respective pixels of the overall render output (e.g. each 2×2 set of sample values may correspond to an output pixel, where 4× multisampling is being used).

The tile buffer is provided as part of RAM that is located on (local to) the graphics processing pipeline (chip).

The data from the tile buffer 10 is input to a downsampling (multisample resolve) write out unit 13, and thence output (written back) to an external memory output buffer, such as a frame buffer of a display device (not shown). (The display device could comprise, e.g., a display comprising an array of pixels, such as a computer monitor or a printer.)

In the present embodiments, the downsampling and writeout unit 13 downsamples (in either a fixed or variable fashion) the fragment data stored in the tile buffer 10 to the appropriate resolution for the output buffer (device) (i.e. such that an array of pixel data corresponding to the pixels of the output device is generated), to generate output values (pixels) for output to the output buffer.

Once a tile of the render output has been processed and its data exported to a main memory (e.g. to a frame buffer in a main memory (not shown)) for storage, the next tile is then processed, and so on, until sufficient tiles have been processed to generate the entire render output (e.g. frame (image) to be displayed). The process is then repeated for the next render output (e.g. frame) and so on.

Other arrangements for the graphics processing pipeline 1 would, of course, be possible.

The above describes certain features of the operation of the graphics processing system shown in FIG. 1. Further features of the operation of the graphics processing system shown in FIG. 1 in accordance with embodiments of the technology described herein will now be described.

In the present embodiment, in the graphics processing pipeline 1, numbers that represent depth values are processed in the graphics processing pipeline 1 using a floating point representation, but when the depth values are written out to and stored in the depth buffer (in the tile buffer 10) (or otherwise stored in memory), they are stored using an unsigned normalized integer ("unorm") representation. Equally, numbers that represent colour values in the graphics processing pipeline 1 are processed in the graphics processing pipeline 1 using a floating point representation, but are stored in the tile buffer 10 or frame buffer in memory using a unorm representation.

Thus, when it is desired to write a depth or colour value to the depth/tile buffer or to memory, the graphics processing pipeline 1 converts the floating point representation of the depth or colour value to a unorm representation of the depth or colour value, and stores the determined unsigned normalized integer representation U of the depth or colour value. Equally, when it is desired to compare or combine, etc., a newly generated floating point depth or colour value with a stored unorm depth or colour value, the graphics processing pipeline 1 converts the floating point representation of the new depth or colour value into a unorm representation of the depth or colour value, and then compares or combines, etc., the new depth or colour value with the stored depth or colour value as appropriate.

Thus, the present embodiment operates to convert a floating point representation of a number x to a corresponding unsigned normalized integer ("unorm") representation U of the number, where the number x may represent a depth value or a colour value (e.g. an RGB or RGB a component) in the graphics processing pipeline 1.

To do this conversion, in the present embodiment, rounding to the nearest integer is used where half integers are rounded up in the conversion. Thus, the value of a b-bit unorm representation U of a number x is given by the equation:

$$U=\text{floor}(x \times (2^b-1)+0.5), \quad (1)$$

where the unorm representation U of the number x is clamped according to:

$U=2^b-1$ for $x \geq 1.0$, and
$U=0$ for $x \leq 0$.

It would also be possible to round half integers down, to round half integers to the nearest even integer, or to round half integers to the nearest odd integer, etc. Where half integers are rounded down, the determination of the unsigned normalized integer representation U of the number x may be done according to the equation (or any equivalents thereof):

$$U=\text{floor}(x \times (2^b-1)+0.49999 \ldots).$$

Where half integers are rounded to the nearest even or odd integer, the rounding may use the integer part I of $(x \times 2^b)$, to determine whether a half integer should be rounded up or down.

In the present embodiment, the floating point number x is defined in accordance with the IEEE 754 Standard, and so is represented by and stored as plural exponent bits, plural mantissa bits, and a sign bit. The floating point number x may have any precision, such as for example 16-bit (half), 32-bit (single), 64-bit (double), or 128-bit (quad) precision. The floating point representation of the number x should be a normalized floating point representation of the number x. Where the number representation of the number x is not normalized, it should be normalized before being processed.

The unorm representation U will be an integer between 0 and $(2^b-1)$ that represents the value of the number, where b is the number of bits, i.e. the precision, of the unorm representation U. Values of the number x in the range 0 to 1 are linearly mapped to unorm integers in the range 0 to $(2^b-1)$, using rounding to the nearest integer. The unorm representation U may have any precision b, such as for example 1-bit, 2-bit, 4-bit, 8-bit, 10-bit, 12-bit, 16-bit, 24-bit or 32-bit precision.

The number x may represent any kind of data, such as depth or "Z" values, or colour (e.g. RGB or RGB a) values, etc. in the graphics processing system.

Figure 2:
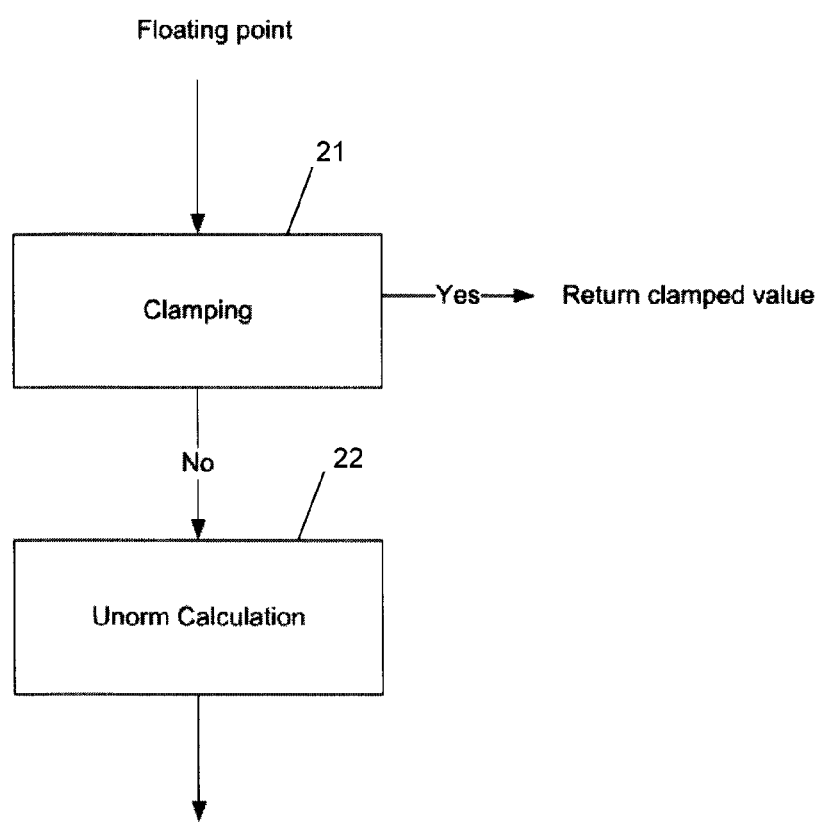
FIG. 2 shows schematically a process in accordance with an embodiment of the technology described herein.

As shown in FIG. 2, in the present embodiment an input floating point representation of a number x to be converted into an unsigned normalized integer representation U is initially subjected to clamping (step 21), e.g. according to the above equations. If the number x is greater than or equal to 1.0, then the unsigned normalized integer representation U of the number is clamped to $(2^b-1)$. If the number x is less than or equal to 0, then the unsigned normalized integer representation U of the number is clamped to 0.

In the present embodiment whether or not the floating point number x is greater than or equal to 1.0 is determined by considering the exponent of the floating point representation of the number x. If the exponent (with the exponent bias applied where appropriate) is larger than or equal to zero, then the number x will be greater than or equal to 1.0. If the exponent (with the exponent bias applied where appropriate) is less than zero, then the number x will be less than 1.0.

Correspondingly, whether or not the number x is less than or equal to 0 is determined by considering the sign bit of the floating point number x (where present). If the sign bit indicates that the number x is negative, then it is determined that number x is less than zero. If the sign bit indicates that the number x is positive, then it is determined that the number x is greater than or equal to zero.

Other techniques would, of course, be possible.

Where the clamping operation is successful, then the clamped value is returned as the final value for the unsigned normalized integer representation U of the number x. Where clamping operation is unsuccessful, then an appropriate unsigned normalized integer representation U is determined in step 22.

In the present embodiment, the calculation of the unorm representation U is based on the recognition that equation (1) can be rewritten as:

$$U=\text{floor}(I+F-x+0.5),$$

where I is the integer part of $(x \times 2^b)$, i.e. $I=\text{floor}(x \times 2^b)$, and F is the fractional part F of $(x \times 2^b)$, i.e. $F=\text{frac}(x \times 2^b)=(x \times 2^b)-I$.

Figure 3:
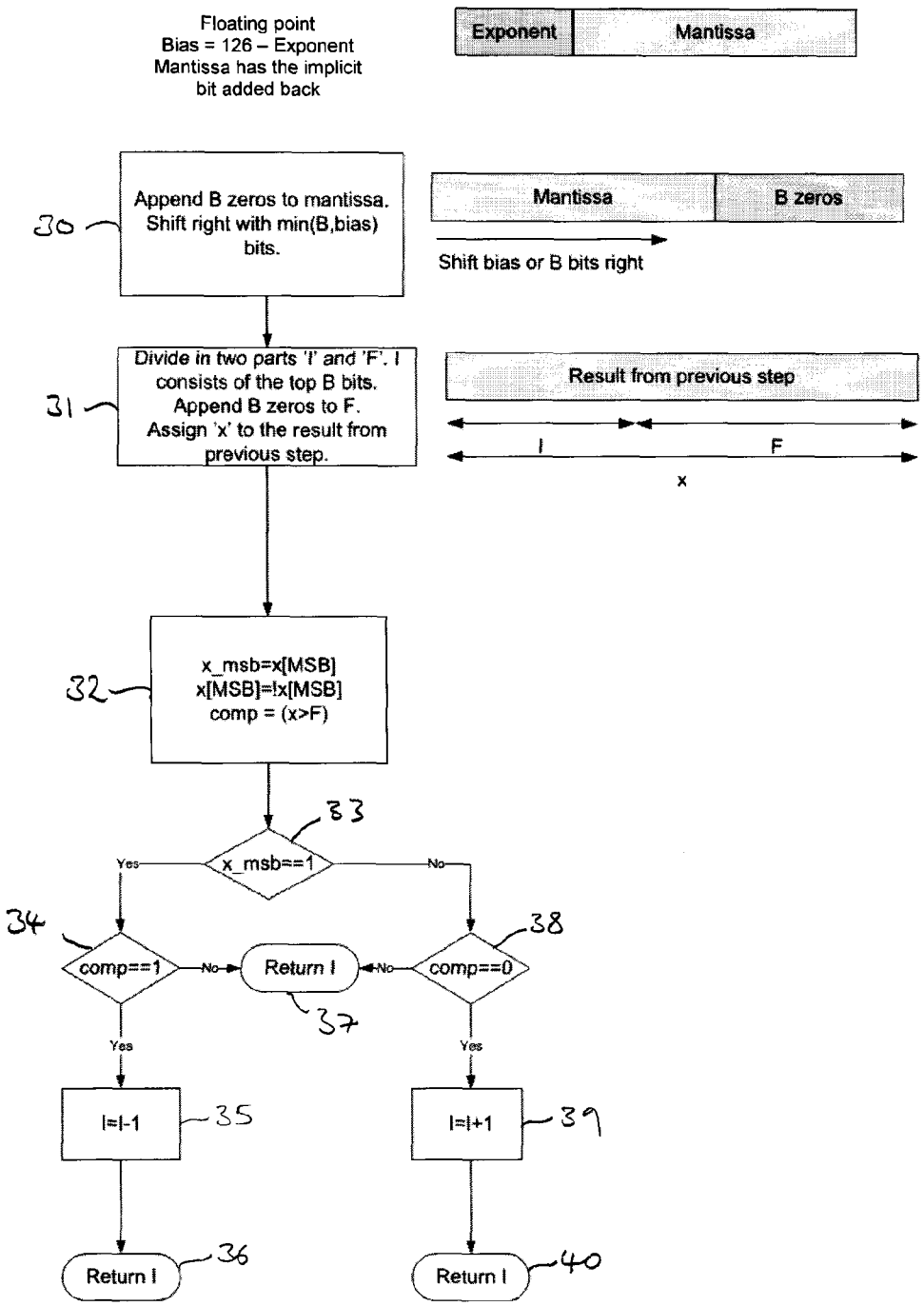
FIG. 3 shows schematically a process in accordance with an embodiment of the technology described herein.

As shown in FIG. 3, in the present embodiment, the values of I and F are determined. This is done by firstly adding the implicit bit to the binary representation of the mantissa of the floating point representation of the number, and then determining a shifted version of the value $(x \times 2^b)$ by appending b zeros to the binary representation of the mantissa of the floating point representation of the number x (which the implicit bit added back) and shifting this value to the right according to a bias (step 30). The bias is selected such that the most significant bit of the resulting value will represent the value 0.5. The bias may be 126 minus the stored exponent or may be b.

The resulting value is assigned to the value "x", the integer part I of $(x \times 2^b)$ is determined by selecting the first b bits of this value, and a shifted version of the fractional part F of $(x \times 2^b)$ is determined by selecting the remaining bits of this value, i.e. the bits of the shifted version of $(x \times 2^b)$ that follow the first b bits and by appending b zeros to these bits (step 31).

The maximum possible value for the quantity (F−x+0.5) is 1.499 . . . , i.e. when F=0.999 . . . and x=0, while the minimum possible value is −0.5, i.e. when F=0 and x=1.0. It can therefore be seen that the unorm representation U of the number can take the values (a) U=I+1 when (F−x+0.5)≥1, (b) U=I when (F−x+0.5)≥0, and (c) U=I−1 when (F−x+0.5)<0.

Where x>0.5, the condition (a) can never be satisfied since (−x+0.5)<0 and F<1.0, and so the integer I itself should be used for the unsigned normalized integer representation U of the number (i.e. U=I), or the integer I should be decremented by one where condition (c) is satisfied (i.e. U=I−1). Condition (c) can be rewritten to: (x−F−0.5)>0; and (x−0.5)−F>0. If we set (x−0.5)=c, then the condition (c) becomes c>F, i.e. the integer I should be decremented when x>0.5 and c>F.

Where x<0.5, the condition (c) above can never be satisfied since (−x+0.5)>0 and F>0, and so the integer I itself should be used for the unsigned normalized integer representation U of the number (i.e. U=I), or the integer I should be decremented by one where condition (a) is satisfied (i.e. U=I+1). Condition (a) can be rewritten as: (F−x+0.5)≥>1; F≥(1−0.5+x); and F≥(0.5+x). If we set (x+0.5)=d, then the condition (a) becomes d≤F, i.e. the integer I should be incremented by one when x<0.5 and d≤F.

Where the number x is equal to 0.5, i.e. x=0.5, then the integer part I of $(x \times 2^b)$ should be used for the unsigned normalized integer representation U of the number, i.e. U=I since conditions (a) and (c) above can never be satisfied.

So, in the present embodiment the unsigned normalized integer representation U of the number is determined by: (i) when x>0.5 and x−0.5>F, decrementing the integer I and using the decremented integer for the unsigned normalized integer representation U of the number; (ii) when x<0.5 and x+0.5≤F, incrementing the integer I, and using the incremented integer for the unsigned normalized integer representation U of the number; and (iii) otherwise (i.e. where x=0.5, x<0.5 and x−0.5≤F, and/or where x<0.5 and x+0.5>F) using the integer part I for the unsigned normalized integer representation U of the number.

The conversion can be translated to in pseudo code as follows:
U=I
if (x>0.5 && ((x−0.5)>F):
U=I−1
if (x<0.5 && ((x+0.5)<F):
U=I+1
For a hardware implementation this may be optimised to:
comp=invert_bit_val_0_5(x)
if comp!=0;
if (comp>F):
   if(bit_val_0_5(x)==1):
     U=I−1
else:
   if(bit_val_0_5(x)==0):
     U=I+1.

The first operation in this optimisation acts to invert the bit of the value "x" as determined above that represents the value 0.5 (which will be the most significant bit for values of the number x between 0 and 1). In this case, if the original number x is exactly equal to 0.5, the result will be zero.

Thus, in the present embodiment, it is effectively determined whether or not the number x is equal to 0.5 by inverting ("flipping") the bit of the shifted binary representation of the mantissa with b appended zeros that represents the value of 0.5 (i.e. the bit that corresponds to $2^{-1}$, the most significant bit), and then comparing the resulting value with zero. If this value is equal to zero, then the number x will be equal to 0.5 (i.e. x=0.5). As described above, in this case, the integer part I should be used for the unsigned normalized integer representation U of the number x.

If this value is not equal to zero, then a comparison is made between the shifted version of the fractional part F of $(x \times 2^b)$ (as determined above) and the shifted binary representation of the mantissa with b appended zeros having its bit that represents the value 0.5 inverted (step 32).

As will be appreciated by those having skill in the art, the effect of inverting the bit of the shifted binary representation of the mantissa with b appended zeros that represents the value of 0.5 will be to add or subtract 0.5 from the number x. For values of the number x that are greater than 0.5, the bit that is inverted will initially be set to 1, whereas for values of the number x that are less than 0.5, this bit will initially be set to 0.

Thus, for values of the number x that are greater than 0.5, the effect of inverting this bit will be to subtract 0.5 from the number x, while for values of the number x that are less than 0.5, the effect of inverting this bit will be to add 0.5 to the number x. Conveniently, the so-determined values correspond to the above values which are to be compared to the fractional part F of $(x \times 2^b)$.

As shown in FIG. 3, if the value of the shifted binary representation of the mantissa with b appended zeros having its bit that represents the value 0.5 inverted is greater than the shifted version of F and x>0.5 (e.g. since the bit that has the value of 0.5 is equal to one) then the decremented version of the integer I should be used for the unsigned normalized integer representation U of the number (step 36). If this value is not greater than the shifted version of F and x<0.5 (e.g. since the bit that represents the value of 0.5 is equal to zero) then the incremented version of the integer I should be used for the unsigned normalized integer representation U of the number (step 40). Otherwise, the integer I should be used for the unsigned normalized integer representation U of the number x (step 37).

As will be appreciated by those of skill in the art, this means that the unorm conversion can be done by a shift, comparison and adder (or adder-subtractor), where the adder performs an increment or a decrement. It will be appreciated by those skilled in the art that this arrangement represents a particularly efficient method for converting from a floating point number to an unsigned normalized integer number, e.g. in terms of the required on-chip area and/or the amount of processing required, and therefore the power consumption.

A number of example operations will now be described in order to illustrate various embodiments of the technology described herein.

The following examples describe the conversion of various floating point representations of a number to the corresponding 4-bit unorm representation of the number. The floating point representations include a sign bit, an exponent and a mantissa. The exponent uses an exponent bias of 127, i.e. so that the "true" exponent may be determined by subtracting the stored exponent from 127. The mantissa is stored absent the implicit bit (i.e. in accordance with the IEEE 754 Standard).

Negative Number
sign=1
exponent=Any
mantissa=Any

In this case, the unorm representation of the number is clamped to zero since the number is negative. This can be determined by examining the sign bit of the floating point representation of the number which is indicative of a negative number.

Number Larger than One
sign=0 exponent=larger than 126
mantissa=Any

In this case, the unorm representation of the number will be clamped to 1 since the number is larger than or equal to 1. This can be determined by examining the exponent of the floating point representation of the number which indicates that the number is larger than or equal to one.

X=0.75
sign=0
exponent=126
mantissa=0x400000

In this case, according to equation (1) above, the unorm representation of the number 0.75 should be:
floor(0.75*15+0.5)=floor(11.75)=11

The first step is to calculate the bias and to append back the implicit one to the mantissa:
bias=126−126=0
mantissa=0xc0_0000

The value $A=(x \times 2^b)$ is then determined by appending b zeros to the mantissa, which in this case will be 4 zeros since we wish to convert to a 4-bit unorm representation. The value is also shifted to the right by an amount corresponding to the bias (which in this case is zero and so will have no effect):
A=0xc00_0000

The values I and F are then assigned; I is the top 4 bits of A and F is the rest with 4 zeros appended. A is also assigned as x.
I=0xc
F=0x0
x=0xc0_0000

The most significant bit of x is then saved. After this, the top bit of x is inverted. This has the effect of adding/subtracting 0.5.
x_msb=1
x=0x40_0000

The resulting value is compared with F:
compare=(x>F)=0x40_0000>0=1

So, in summary, we have:
I=0xc
x_msb=1
compare=1

This means that result will be I−1, and the resulting unorm representation of the number 0.75 will be 0xb=11.

X=0.24609375
sign=0
exponent=124
mantissa=0x7c0000

In this case, according to equation (1) above, the unorm representation of the number 0.24609375 should be:
floor(0.24609375*15+0.5)=floor(4.19)=4

The first step is to calculate the bias and to append back the implicit one to the mantissa:
bias=126−124=2
mantissa=0xfc_0000

The value $A=(x \times 2^b)$ is then determined by appending b zeros to the mantissa, which in this case will be 4 zeros since we wish to convert to a 4-bit unorm representation, and shifting the value to the right by an amount corresponding to the bias:
A=0x3f0_0000

The values I and F are then assigned; I is the top 4 bits of A and F is the rest with 4 zeros appended. A is also assigned as x.
I=0x3
F=0xf00_0000
mantissa=0x3f0_0000

The most significant bit of x is then saved. After this, the top bit of x is inverted. This has the effect of adding/subtracting 0.5.
x_msb=0
x=0xbf0_0000

The resulting value is compared with F:
compare=(x>F)=0xbf_0000>f00_0000=0

So, in summary, we have:
I=0x3
x_msb=1
compare=0

This means that result will be I+1, and the resulting unorm representation of the number 0.24609375 will be 0x4=4.

As can be seen from the above, the technology described herein, in its embodiments at least, provides a simple and effective technique for determining an unsigned normalized integer representation U of a number x that has a value between 0 and 1.

This is achieved, in the embodiments of the technology described herein at least, by determining whether to use the integer part I of $(x \times 2^b)$, an incremented version of the integer part I, or a decremented version of the integer part I, for the unsigned normalized integer representation U of the number x based on a comparison that uses the fractional part F of $(x \times 2^b)$ and the number x.

The foregoing detailed description has been presented for the purposes of illustration and description. It is not intended to be exhaustive or to limit the technology to the precise form disclosed. Many modifications and variations are possible in the light of the above teaching. The described embodiments were chosen in order to best explain the principles of the technology and its practical application, to thereby enable others skilled in the art to best utilise the technology in various embodiments and with various modifications as are suited to the particular use contemplated. It is intended that the scope be defined by the claims appended hereto.

What is claimed is:

1. A method of operating graphics processing system, comprising:
   when generating a render output the graphics processing system:
   processing a colour or depth data value using a floating point representation to generate a floating point output colour or depth data value, the colour or depth data value comprising a number x; and
   converting the floating point representation of the output colour or depth data value to a b-bit unsigned normalized integer representation U of the output colour or depth data value by
   when the number x has a value between 0 and 1 the graphics processing system:
   determining the integer part I of $(x \times 2^b)$; and
   determining whether to use the integer part I, an incremented version of the integer part I, or a decremented version of the integer part I for the unsigned normalized integer representation U of the number x based on a comparison that uses the fractional part F of $(x \times 2^b)$ and the number x;
   the graphics processing system comparing the unsigned normalized integer representation U of the output colour or depth data value with one or more stored unsigned normalized integer colour or depth data values and/or storing the unsigned normalized integer representation U of the output colour or depth data value; and the graphics processing system using the unsigned normalized integer representation U of the output colour or depth data value to generate an image for display and providing the image to a display.

2. The method of claim 1, further comprising:
when the number x has a value that is greater than or equal to 1, clamping the unsigned normalized integer representation U of the number x to a first predefined value; and
when the number x has a value that is less than or equal to 0, clamping the unsigned normalized integer representation U of the number x to a second predefined value.

3. The method of claim 1, further comprising using one or more shift operations to determine the integer part I and/or the fractional part F of $(x \times 2^b)$.

4. The method of claim 1, wherein determining the unsigned normalized integer representation U of the number x comprises:
using a decremented version of the integer I for the unsigned normalized integer representation U of the number when x>0.5 and x−0.5>F;
using an incremented version of the integer I for the unsigned normalized integer representation U of the number when x<0.5 and x+0.5≤F; and
otherwise using the integer part I for the unsigned normalized integer representation U of the number.

5. The method of claim 1, further comprising:
inverting the bit of the binary representation of the floating point representation of the number x that represents the value 0.5; and
determining whether the number x is equal to 0.5 by comparing zero with the value of the binary representation of the floating point number x having its bit that represents the value 0.5 inverted.

6. The method of claim 1, further comprising determining whether the number x is greater than 0.5 and/or whether the number x is less than 0.5 using the value of the bit of the binary representation of the floating point representation of the number x that represents the value 0.5.

7. The method of claim 1, further comprising:
inverting the bit of the binary representation of the floating point representation of the number x that represents the value 0.5;
wherein the comparison comprises comparing the representation of the number x having its bit that represents the value 0.5 inverted to the fractional part F of $(x \times 2^b)$.

8. The method of claim 1, comprising:
using one or more shift operations, one or more comparison operations, and one or more addition operations to determine an unsigned normalized integer representation U of the number x.

9. A graphic processing system, comprising apparatus for determining a b-bit unsigned normalized integer representation U of a number x that has a value between 0 and 1, comprising:
processing circuitry configured to determine the integer part I of $(x \times 2^b)$; and
processing circuitry configured to determine whether to use the integer part I, an incremented version of the integer part I, or a decremented version of the integer part I for the unsigned normalized integer representation U of the number x based on a comparison that uses the fractional part F of $(x \times 2^b)$ and the number x;
wherein the graphics processing system is configured to:
when generating a render output:
process one or more colour or depth data values using a floating point representation to generate one or more floating point output colour or depth data values;
convert the floating point representations of the one or more output colour or depth data values to respective unsigned normalized integer representations UI of the one or more output colour or depth data values;
compare the unsigned normalized integer representations U of the one or more output colour or depth data values with one or more stored unsigned normalized integer colour or depth data values and/or store the unsigned normalized integer representations U of the one or more output colour or depth data values; and
use the unsigned normalized integer representation U of the output colour or depth data value to generate an image for display and provide the image to a display.

10. The graphics processing system of claim 9, wherein the apparatus is configured to:
clamp the unsigned normalized integer representation U of the number x to a first predefined value when determining a b-bit unsigned normalized integer representation U of a number x that is greater than or equal to 1; and
clamp the unsigned normalized integer representation U of the number x to a second predefined value when determining a b-bit unsigned normalized integer representation U of a number x that is less than or equal to 0.

11. The graphics processing system of claim 9, wherein the apparatus is configured to use one or more shift operations to determine the integer part I and/or the fractional part F of $(x \times 2^b)$.

12. The graphics processing system claim 9, wherein the apparatus is configured to determine the unsigned normalized integer representation U of the number x by:
using a decremented version of the integer I for the unsigned normalized integer representation U of the number when x>0.5 and x−0.5>F;
using an incremented version of the integer I for the unsigned normalized integer representation U of the number when x<0.5 and x+0.5≤F; and
otherwise using the integer part I for the unsigned normalized integer representation U of the number.

13. The graphics processing system of claim 9, wherein the apparatus is configured to:
invert the bit of the binary representation of the floating point representation of the number x that represents the value 0.5; and
determine whether the number x is equal to 0.5 by comparing zero with the value of the binary representation of the floating point number x having its bit that represents the value 0.5 inverted.

14. The graphics processing system of claim 9, wherein the apparatus is configured to determine whether the number x is greater than 0.5 and/or whether the number x is less than 0.5 using the value of the bit of the binary representation of the floating point representation of the number x that represents the value 0.5.

15. The apparatus of claim 9, wherein:
the apparatus is configured to invert the bit of the binary representation of the floating point representation of the number x that represents the value 0.5; and
the comparison compares the representation of the number x having its bit that represents the value 0.5 inverted to the fractional part F of $(x \times 2^b)$.

16. The graphics processing system of claim 9, comprising:

a shifter, a comparator and an adder;
wherein the shifter, the comparator and the adder are configured to determine an unsigned normalized integer representation U of the number x.

17. A non-transitory computer readable storage medium storing computer software code which when executing on a processor performs a method of operating a graphics processing system, the method comprising:
when generating a render output:
processing a colour or depth data value using a floating point representation to generate a floating point output colour or depth data value, the colour or depth data value comprising a number x; and
converting the floating point representation of the output colour or depth data value to a b-bit unsigned normalized integer representation U of the output colour or depth data value by:
when the number x has a value between 0 and 1:
determining the integer part I of $(x \times 2^b)$; and
determining whether to use the integer part I, an incremented version of the integer part I, or a decremented version of the integer part I for the unsigned normalized integer representation U of the number x based on a comparison that uses the fractional part F of $(x \times 2^b)$ and the number x;
the method further comprising comparing the unsigned normalized integer representation U of the output colour or depth data value with one or more stored unsigned normalized integer colour or depth data values and/or storing the unsigned normalized integer representation U of the output colour or depth data value; and
using the unsigned normalized integer representation U of the output colour or depth data value to generate an image for display and providing the image to a display.

* * * * *